(12) United States Patent
Snowdon et al.

(10) Patent No.: US 10,097,084 B2
(45) Date of Patent: Oct. 9, 2018

(54) LOW VOLTAGE SWITCH CONTROL

(71) Applicant: Fairchild Semiconductor Corporation, San Jose, CA (US)

(72) Inventors: Kenneth P. Snowdon, Falmouth, ME (US); Julie Lynn Stultz, Scarborough, ME (US)

(73) Assignee: Fairchild Semiconductor Corporation, Sunnyvale, CA (US)

( * ) Notice: Subject to any disclaimer, the term of this patent is extended or adjusted under 35 U.S.C. 154(b) by 33 days.

(21) Appl. No.: 15/079,291

(22) Filed: Mar. 24, 2016

(65) Prior Publication Data

US 2016/0204696 A1 Jul. 14, 2016

Related U.S. Application Data

(60) Provisional application No. 62/137,442, filed on Mar. 24, 2015.

(51) Int. Cl.
*H03K 17/687* (2006.01)
*H02M 3/07* (2006.01)
(Continued)

(52) U.S. Cl.
CPC ............ *H02M 3/07* (2013.01); *H03K 17/145* (2013.01); *H03K 17/6871* (2013.01);
(Continued)

(58) Field of Classification Search
CPC ............ H03K 17/063; H03K 17/0822; H03K 17/04123; H03K 2217/0036; H03K 17/687
(Continued)

(56) References Cited

U.S. PATENT DOCUMENTS 5,350,951 A * 9/1994 Adachi ................ H02J 9/061
 327/389
5,682,050 A * 10/1997 Williams ............. H01L 29/78
 257/368

(Continued)

FOREIGN PATENT DOCUMENTS

CN 102647156 A 8/2012
CN 102647178 A 8/2012
(Continued)

OTHER PUBLICATIONS

First Office Action for Chinese Application No. 201610176477.4, dated May 4, 2018, 7 pages.

*Primary Examiner* — Quan Tra
(74) *Attorney, Agent, or Firm* — Brake Hughes Bellermann LLP

(57) ABSTRACT

Systems and methods are disclosed, including, for example, a low-voltage control circuit configured to receive a charge pump voltage, a rail voltage, and a switch control signal, to provide the charge pump voltage when the switch control signal is in a first state, and to provide the higher of the charge pump voltage and the rail voltage when the switch control signal is in a second state. The system can include a first pick-high circuit configured to receive the rail voltage and the charge pump voltage, and to provide the higher of the rail voltage and the charge pump voltage at an output. The switch control signal, in the first state, can include the output of the pick-high circuit. Methods of forming such apparatus are disclosed, as well as methods of operation, and other embodiments.

21 Claims, 3 Drawing Sheets

(51) Int. Cl.
*H03K 17/14* (2006.01)
*H03K 17/06* (2006.01)

(52) U.S. Cl.
CPC ... *H03K 17/063* (2013.01); *H03K 2217/0018* (2013.01); *H03K 2217/0054* (2013.01); *H03K 2217/0081* (2013.01)

(58) Field of Classification Search
USPC .................................................. 327/427, 434
See application file for complete search history.

(56) References Cited

U.S. PATENT DOCUMENTS

| | | | |
|---|---|---|---|
| 7,692,473 B2 * | 4/2010 | Ono | H01L 27/0255 327/303 |
| 2007/0146953 A1 | 6/2007 | Ono | |
| 2012/0086499 A1 * | 4/2012 | Husain | H03K 17/145 327/434 |
| 2012/0206845 A1 * | 8/2012 | Gagne | H03K 17/063 361/86 |
| 2013/0249621 A1 * | 9/2013 | Gagne | H03K 17/063 327/408 |

FOREIGN PATENT DOCUMENTS

| | | |
|---|---|---|
| CN | 103326698 A | 9/2013 |
| CN | 104168012 A | 11/2014 |

* cited by examiner

LOW VOLTAGE SWITCH CONTROL

CLAIM OF PRIORITY

This application claims the benefit of priority under 35 U.S.C. § 119 of Kenneth P. Snowdon et al. U.S. Provisional Patent Application Ser. No. 62/137,442, titled "LOW VOLTAGE SWITCH CONTROL," filed on Mar. 24, 2015, which is incorporated by reference herein in its entirety.

BACKGROUND

Pass gates are electronic components used to either pass a signal between first and second terminals in a first, low-impedance state (e.g., an "on" state), or to isolate the first and second terminals in a second, high-impedance state (e.g., an "off" state). A pass gate can include one or more metal-oxide-semiconductor field-effect transistors (MOSFETs) configured to pass an input signal between a source and a drain of a transistor, or to isolate the source from the drain, based on, for example, one or more control signals provided to a gate of the transistor.

Pass gates can pass various types of signals between an input and an output (e.g., the first and second terminals, respectively). The control signals for the one or more transistors in the pass gate can depend on the characteristics of the signal being transferred and the type of transistors in the pass gate. In certain examples, to keep the pass gate in a desired state, the control signals must be either more positive or more negative than the signals at the first or second terminals. In other examples, to provide an accurate representation of an input signal at an output, the control signals can follow the input signal, such as to provide a constant gate-to-source voltage of the one or more transistors, reducing impedance variation between the first and second terminals while the one or more transistors are in a desired state.

Overview

This document discusses, among other things, a system including, for example, a low-voltage control circuit configured to receive a charge pump voltage, a rail voltage, and a switch control signal, to provide the charge pump voltage when the switch control signal is in a first state, and to provide the higher of the charge pump voltage and the rail voltage when the switch control signal is in a second state. The system can include a first pick-high circuit configured to receive the rail voltage and the charge pump voltage, and to provide the higher of the rail voltage and the charge pump voltage at an output. The switch control signal, in the first state, can include the output of the pick-high circuit.

In another example, the system can include a pass gate configured to pass (e.g., provide a low-impedance path for) a signal from a first terminal to a second terminal in a first, low-impedance state, and to isolate (e.g., electrically isolate) the first terminal from the second terminal in a second, high-impedance state, and a low-voltage control circuit configured to provide a charge pump voltage to control the pass gate when the pass gate is in the first, low-impedance state, and to provide the higher of the charge pump voltage and a rail voltage to control the pass gate when the pass gate is in the second, high-impedance state.

Methods of forming such apparatus are also disclosed, as well as methods of operation, and other embodiments.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
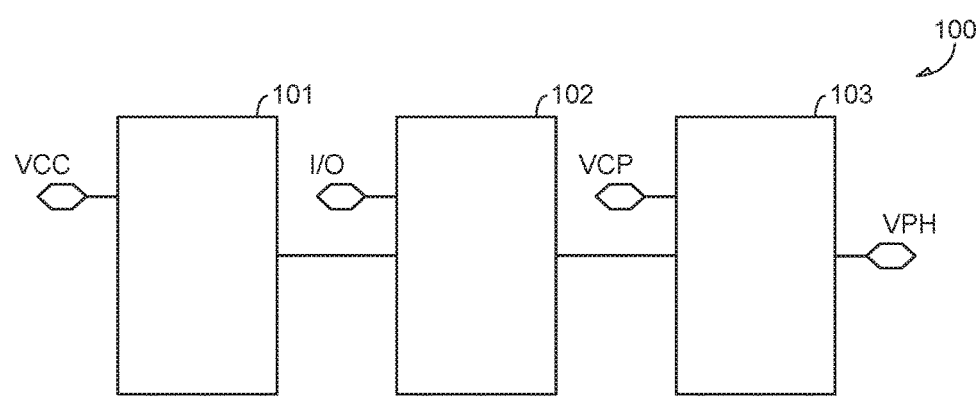
FIG. 1 illustrates generally example system including first, second, and third power domains.

FIG. 1 illustrates generally example system 100 including first, second, and third power domains 101, 102, 103. The first power domain 101 can receive a source voltage (VCC). Power in the first power domain 101 can be based on only the source voltage (VCC).

The second power domain 102 can receive power from the first power domain 101 and an input/output (I/O), such as one or more terminals of a pass gate. Power in the second power domain 102 can be based on the higher of the source voltage (VCC) and the I/O. For example, in a simple pass gate, to ensure that the pass gate stays in a desired state e.g., a high-impedance or "off" state when coupled to an input having a varying voltage level, or if the source voltage (VCC) is lost, the control signal (e.g., a gate signal) for one or more transistors in the pass gate be at or above the highest voltage at the source or drain of the one or more transistors in the pass gate.

The third power domain 103 can receive power from the second power domain 102 and a charge pump voltage (VCP). In an example, the charge pump voltage can be a constant voltage. In other examples, the charge pump voltage can vary depending on, for example, a value at one or more terminals of a pass gate ((e.g., the charge pump voltage can be based on the common mode voltage of a terminal of the pass gate in an "on" state). Power in the third power domain 103 can be based on the higher of the source voltage (VCC), the I/O, and the charge pump voltage (VCP), and the third power domain 103 can be configured to provide a pick-high voltage (VPH) at an output, which is the higher of the source voltage (VCC), the I/O, and the charge pump voltage (VCP).

The present inventors have recognized, among other things, a low-voltage control system that can pass a control signal to a pass gate higher or lower than one or more other voltages in the system, such as the source voltage (VCC). For example, in a system having a varying source voltage, such as between 2V and 5V, etc., a charge pump can be used to provide a steady control signal, or a control signal higher than the voltage at the first or second terminals of a pass gate. However, when the source voltage is higher than the charge pump voltage, and the higher source voltage is provided to the pass gate, the gate-to-source voltage (VGS) of the pass gate can change, altering one or more characteristics (e.g., resistance, etc.) of one or more transistors in the pass gate. Accordingly, it can be advantageous to not default to the highest voltage in a system, depending on a type of pass gate or a desired state of the pass gate.

In an example, a low-voltage control switch can be placed between the second and third power domains 102, 103. The low-voltage control circuit can provide a charge pump voltage to a control input of a pass gate (directly or through one or more components in a first state, and can provide the higher of a charge pump voltage or one or more other voltages (e.g., a source voltage (VCC), a voltage of one or more terminals of the pass gate, etc.) to the control input of the pass gate in a second state.

Figure 2:
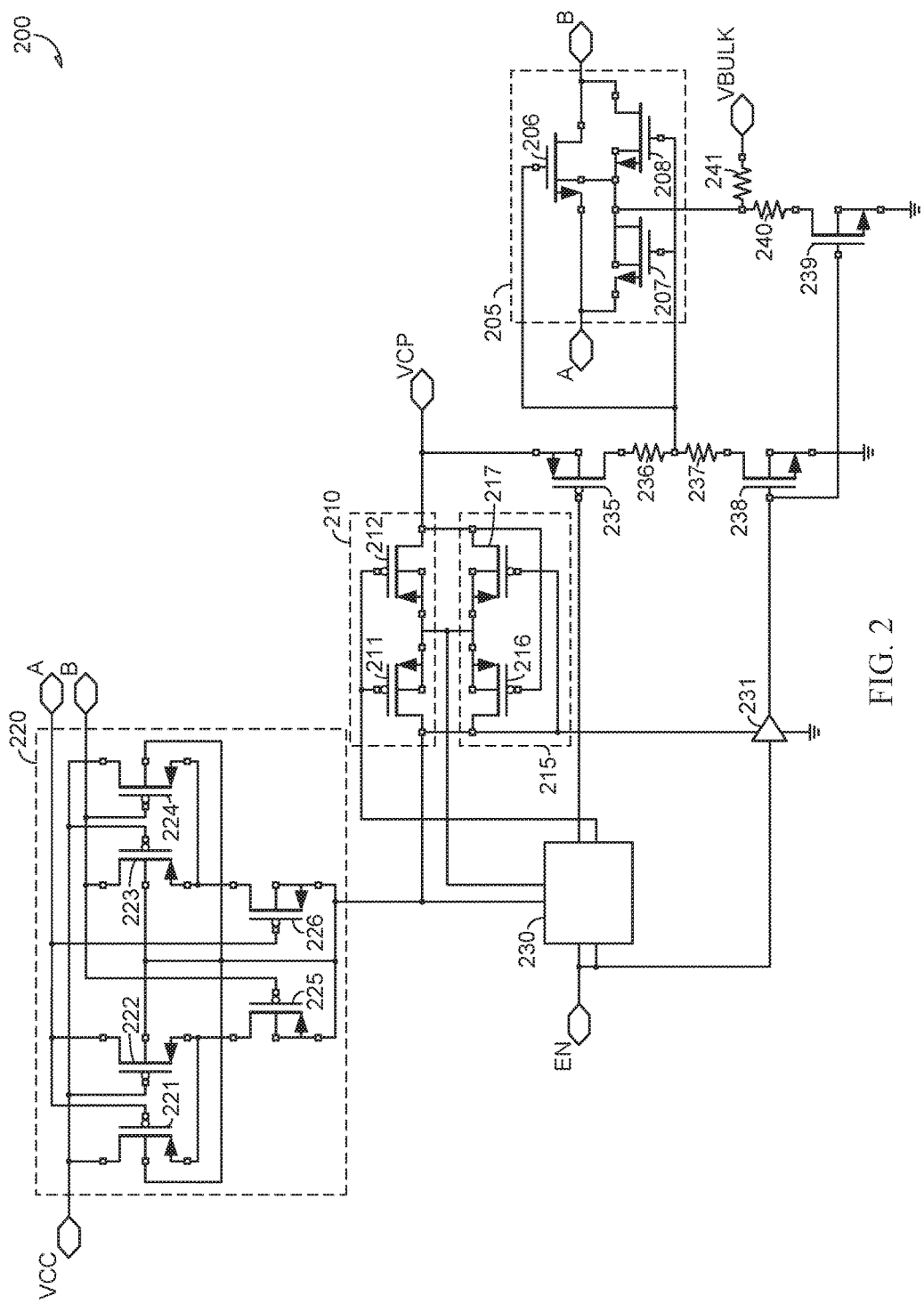
FIG. 2 illustrates generally an example system including a pass gate, a low-voltage control circuit, first and second pick-high circuits, and a translator.

FIG. 2 illustrates generally an example low-voltage control system 200 including a pass gate 205 configured to pass a signal from a first terminal (A) (e.g., an input) to a second terminal (B) (e.g., an output) in a first, low-impedance state (e.g., an "on" state) and to isolate (e.g., electrically isolate) the first terminal (A) from the second terminal (B) in a second, high-impedance state (e.g., an "off" state), and other electronics, including a low-voltage control circuit 210, first and second pick-high circuits 215, 220, a translator 230, and one or more drive components.

The pass gate 205 in the example of FIG. 2 includes first, second, and third n-type semiconductor (NMOS) transistors 206, 207, 208, each including a gate, a source, a drain, and a bulk. The sources of the first and second NMOS transistors are coupled to the first terminal (A), and the drains of the first and third NMOS transistors are coupled to the second terminal (B). Though in other examples, other numbers, types, or configurations of transistors can be used. However, in this example, because the pass gate 205 includes n-type transistors, a control signal having a voltage higher than the signal at the first and second terminals is required to maintain the pass gate 205 in an "on" state, and a control signal based on the signal at the first and second terminals (e.g., the voltage at the first terminal plus 1.9V, etc.) is required to maintain a constant gate-to-source voltage (VGS) for the pass gate 205.

The second pick-high circuit 220 can be configured to receive a source voltage (VCC) and a voltage of at least one of the first terminal (A) or the second terminal (B) of the pass gate 205, and can provide the higher of the received voltages as a rail voltage (VRAIL) at an output. In the example of FIG. 2, the output can be coupled to the low-voltage control circuit 210 and the translator 230. The second pick-high circuit 220 can include six p-type semiconductor (PMOS) transistors 221-226. In other examples, the second pick-high circuit 220 can include one or more other transistors, transistor types, or configurations.

The first pick-high circuit 215 can be configured to receive the rail voltage (VRAIL) from the second pick-high circuit 220 and a charge pump voltage (VCP) (e.g., from a charge pump circuit), and can provide the higher of the rail voltage (VRAIL) and the charge pump voltage (VCP) as a pick-high voltage (VPH) at an output. The first pick-high circuit 215 can include two source-coupled PMOS transistors 216, 217, the first configured to receive the rail voltage (VRAIL) at a drain and a charge pump voltage (VCP) at a gate, and the second configured to receive the charge pump voltage (VCP) at a drain and the rail voltage (VRAIL) at a gate. In other examples, the first pick-high circuit can include one or more other transistors, transistor types, or configurations.

The translator 230 can be configured to receive an enable signal, such as from a processor or one or more other control circuits, etc., the rail voltage (VRAIL) from the second pick-high circuit 220, and the pick-high voltage (VPH) from the first pick-high circuit 215, and can provide first and second translated outputs (OVT_H) to a gate of a first drive transistor 235 and to the low-voltage control circuit 210, respectively. In an example, the first translated output can be high while the second translated output is low. In other examples, one or more other configurations can be used.

The low-voltage control circuit 210 can be configured to provide a charge pump voltage (VCP) to the source of the first drive transistor 235 when the pass gate 205 is in the first, low-impedance state, and to provide the higher of the charge pump voltage and a rail voltage (e.g., a pick-high voltage (VPH)) to the first drive transistor 235 when the pass gate is in the second, high-impedance state, for example, to keep the first drive transistor 235 in an "off" state in the case that the pass gate 105 is in an "off" state and the pick-high voltage (VPH) is higher than the charge pump voltage (VCP), etc. The low-voltage control circuit 210 can include two source-coupled PMOS transistors 211, 212, the first configured to receive an output of the translator 230 at a gate, the rail voltage (VRAIL) from the second pick-high circuit 220 at a drain, and the pick-high voltage (VPH) at a source, and the second configured to receive the output of the translator 230 at the gate, the charge pump voltage (VCP) at a drain, and the pick-high voltage (VPH) at a source. In other examples, the low-voltage control circuit 210 can include one or more other transistors, transistor types, or configurations.

The first drive transistor 235 can be coupled to a second drive transistor 238 through first and second resistors 236, 237. The low-voltage control system 200 can include an inverter 231 configured to receive the enable signal and to provide a control signal to the second drive transistor 238 and a third drive transistor 239. The pass gate 205 can receive a control signal from the first drive transistor 235 through the first resistor 236, or from the second drive transistor 238 through the second resistor 237, depending on the enable signal (EN). The third drive transistor 239 can couple bulk terminals of the pass gate 205 to ground through a third resistor 240, or to a bulk voltage (VBULK) through a fourth resistor 241 depending on a desired configuration.

Although illustrated herein as PMOS devices, the first and second pick-high circuits 215, 220 and the low-voltage control circuit 210 can, in other examples, include one or more NMOS transistor, or a combination of PMOS and NMOS devices to achieve similar operation. Further, a similar architecture, only with NMOS devices instead of PMOS devices could be used to drive the lowest value of the source voltage (VCC), the first and second terminals (A, B), or the charge pump voltage (VCP), if desired.

Figure 3:
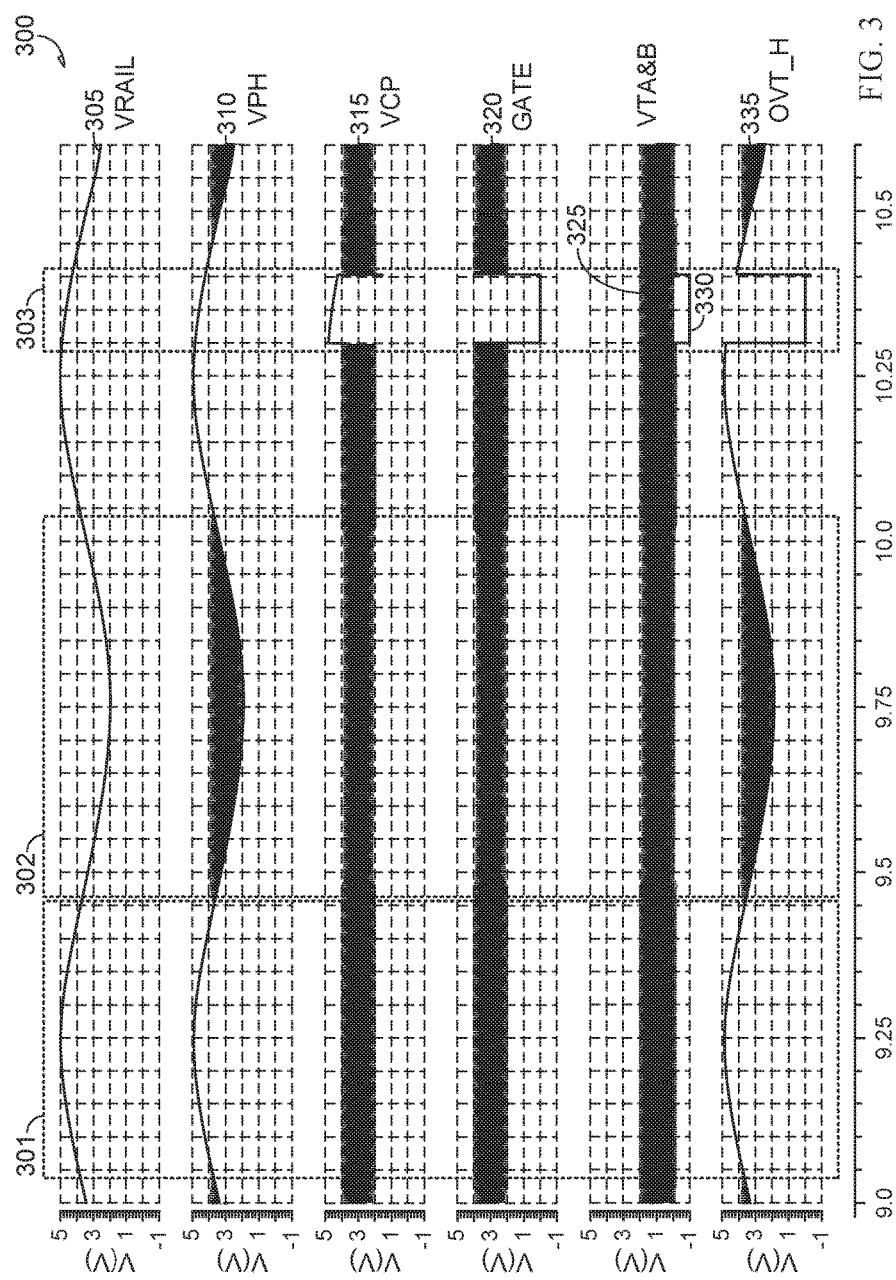
FIG. 3 illustrates generally example low-voltage control circuit and pass gate waveforms.

FIG. 3 illustrates generally example low-voltage control circuit and pass gate waveforms 300 in first, second, and third regions of operation 301, 302, 303, the various waveforms including, for example, a rail voltage (VRAIL) 305, a pick-high voltage (VPH) 310, a charge pump voltage (VCP) 315, a gate voltage (GATE) 320 for one or more of the gates of the transistors of the pass gate, first and second terminal voltages (VTA&B) 325, 330, and a translated enable signal (OVT_H).

The first region of operation 301 illustrates various waveforms from the example of FIG. 2 when the rail voltage (VRAIL) 305 is greater than a charge pump voltage (VCP) 315. The rail voltage (VRAIL) 305 varies between 2 and 5 volts, whereas the charge pump voltage (VCP) 315 sits approximately 2 volts above the first and second terminal voltages (VTA&B) 325, 330.

The second region of operation 302 illustrates the various waveforms when the rail voltage (VRAIL) 305 is less than the charge pump voltage (VCP) 315. In an example, when the rail voltage (VRAIL) 305 is less than the charge pump voltage (VCP) 15, and the pass gate is "on", the pick-high voltage (VPH) can include the portion of the charge pump voltage (VCP) 315 that goes above the rail voltage (VRAIL) 305.

The third region of operation 303 illustrates various waveforms when the pass gate is in an "off" state. In an example, a low-voltage control circuit can be configured to provide the pick-high voltage (VPH) 310 as the charge pump voltage (VCP) 315.

ADDITIONAL NOTES AND EXAMPLES

In Example 1, a low-voltage control system includes a pass gate configured to pass a signal from a first terminal to a second terminal in a first, low-impedance state, and to isolate the first terminal from the second terminal in a second, high-impedance state, and a low-voltage control circuit configured to provide a charge pump voltage when the pass gate is in the first, low-impedance state, and to provide the higher of the charge pump voltage and a rail voltage when the pass gate is in the second, high-impedance state, wherein the pass gate is controlled using the low-voltage control circuit.

In Example 2, the low voltage control circuit of Example 1 is optionally configured to receive a switch control signal, and wherein, when the pass gate is in the first, low-impedance state, the switch control signal is configured to be the higher of the charge pump voltage and the rail voltage.

In Example 3, the low voltage control circuit of any one or more of Examples 1-2 optionally includes first and second p-type semiconductor (PMOS) transistors, each including a source, a gate, and a drain, the drain of the first PMOS transistor is configured to receive the rail voltage, the drain of the second PMOS transistor is configured to receive the charge pump voltage, and the sources of the first and second PMOS transistors is configured to receive the higher of the rail voltage and the charge pump voltage.

In Example 4, any one or more of Examples 1-3 optionally includes a first pick-high circuit configured to receive the rail voltage and the charge pump voltage, and to provide the higher of the rail voltage and the charge pump voltage at an output, wherein the low-voltage control circuit is configured to receive a switch control signal, to provide the charge pump voltage when the switch control signal is in a first state, and to provide the higher of the charge pump voltage and the rail voltage when the switch control signal is in a second state, and the switch control signal in the first state includes the output of the pick-high circuit.

In Example 5, the low voltage control circuit of any one or more of Examples 1-4 is optionally configured to receive a switch control signal, wherein the pass gate is in the first, low-impedance state when the switch control signal is in the first state.

In Example 6, any one or more of Examples 1-5 optionally includes a second pick-high circuit configured to receive a source voltage and a first terminal voltage of the pass gate, and to provide the higher of the source voltage and the first terminal voltage as the rail voltage at an output, wherein the first terminal voltage is the voltage at the first terminal of the pass gate, and the charge pump voltage is based on the first terminal voltage.

In Example 7, the second pick-high circuit of any one or more of Examples 106 is optionally configured to receive the source voltage, the first terminal voltage of the pass gate, and a second terminal voltage of the pass gate, and to provide the higher of the received voltages as the rail voltage at an output, wherein the second terminal voltage is the voltage at the second terminal of the pass gate, and wherein the charge pump voltage is based on at least one of the first or second terminal voltages.

In Example 8, any one or more of Examples 1-7 optionally includes a translation circuit configured to receive the outputs of the first and second pick-high circuits and a control signal, and to provide an output using the higher of the outputs of the first and second pick-high circuits and the control signal, wherein, when the pass gate is in the first, low-impedance state, the switch control signal includes the output of the translation circuit.

In Example 9, a low-voltage control apparatus of any one or more of Examples 1-8 optionally includes a first pick-high circuit configured to receive a rail voltage and a charge pump voltage, and to provide the higher of the rail voltage and the charge pump voltage at an output, and a low-voltage control circuit configured to receive the charge pump voltage, the rail voltage, and a switch control signal, to provide the charge pump voltage when the switch control signal is in a first state, and to provide the higher of the charge pump voltage and the rail voltage when the switch control signal is in a second state, wherein the switch control signal in the first state includes the output of the pick-high circuit.

In Example 10, any one or more of Examples 1-9 optionally includes a pass gate configured to pass a signal from a first terminal to a second terminal in a first, low-impedance state, and to isolate the first terminal from the second terminal in a second, high-impedance state, wherein the pass gate is controlled using the low-voltage control circuit.

In Example 11, when the pass gate is in the first, low-impedance state, the switch control signal of any one or more of Examples 1-10 is optionally configured to be the higher of the charge pump voltage and the rail voltage.

In Example 12, the low voltage control circuit of any one or more of Examples 1-11 optionally includes first and second p-type semiconductor (PMOS) transistors, each including a source, a gate, and a drain, wherein the drain of the first PMOS transistor is configured to receive the rail voltage, and the drain of the second PMOS transistor is configured to receive the charge pump voltage, and wherein the sources of the first and second PMOS transistors is configured to receive the higher of the rail voltage and the charge pump voltage.

In Example 13, any one or more of Examples 1-12 optionally includes a second pick-high circuit configured to receive a source voltage and a first terminal voltage of the pass gate, and to provide the higher of the source voltage and the first terminal voltage as the rail voltage at an output, wherein the first terminal voltage is the voltage at the first terminal of the pass gate, and wherein the charge pump voltage is based on the first terminal voltage.

In Example 14, the second pick-high circuit of any one or more of Examples 1-13 is optionally configured to receive the source voltage, the first terminal voltage of the pass gate, and a second terminal voltage of the pass gate, and to provide the higher of the received voltages as the rail voltage at an output, wherein the second terminal voltage is the voltage at the second terminal of the pass gate, wherein the charge pump voltage is based on at least one of the first or second terminal voltages.

In Example 15, any one or more of Examples 1-14 optionally includes a translation circuit configured to receive the outputs of the first and second pick-high circuits and a control signal, and to provide an output using the higher of the outputs of the first and second pick-high circuits and the control signal, wherein, when the pass gate is in the first, low-impedance state, the switch control signal includes the output of the translation circuit.

In Example 16, a method includes receiving a charge pump voltage, a rail voltage, and a switch control signal at a low-voltage control circuit, and providing the charge pump voltage at an output of the low-voltage control circuit when the switch control signal is in a first state, and the higher of the charge pump voltage and a rail voltage when the switch control signal is in a second state.

In Example 17, any one or more of Examples 1-16 optionally includes passing a signal from a first terminal of a pass gate to a second terminal of the pass gate in a first, low-impedance state, isolating the first terminal of the pass gate from the second terminal of the pass gate in a second, high-impedance state, and controlling the pass gate using the output of the low-voltage control circuit.

In Example 18, the low voltage control circuit of any one or more of Examples 1-17 optionally includes first and second p-type semiconductor (PMOS) transistors, each including a source, a gate, and a drain, wherein the drain of the first PMOS transistor is configured to receive the rail voltage, and the drain of the second PMOS transistor is configured to receive the charge pump voltage, and wherein the sources of the first and second PMOS transistors is configured to receive the higher of the rail voltage and the charge pump voltage.

In Example 19, receiving the rail voltage and the charge pump voltage and providing the higher of the rail voltage and the charge pump voltage at an output of a first pick-high circuit, wherein the switch control signal in the first state includes the output of the pick-high circuit.

In Example 20, any one or more of Examples 1-19 optionally includes receiving a source voltage and a first terminal voltage of a pass gate, and providing the higher of the source voltage and the first terminal voltage as the rail voltage at an output of a second pick-high circuit, wherein the charge pump voltage is based on the first terminal voltage.

In Example 21, a system or apparatus can include, or can optionally be combined with any portion or combination of any portions of any one or more of Examples 1-20 to include, means for performing any one or more of the functions of Examples 1-20, or a machine-readable medium including instructions that, when performed by a machine, cause the machine to perform any one or more of the functions of Examples 1-20.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein. If two elements are shown in the drawings with a line connecting them, the two elements can be either be coupled, or directly coupled, unless otherwise indicated. If two elements are coupled, one or more intervening elements may be present. In contrast, in embodiments where an element is referred to as "directly coupled" to another element, there can be no intervening elements in those embodiments.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A low-voltage control system, comprising:
a pass gate configured to pass a signal from a first terminal to a second terminal in a first, low-impedance state, and to isolate the first terminal from the second terminal in a second, high-impedance state; and
a low-voltage control circuit configured to provide a charge pump voltage when the pass gate is in the first, low-impedance state, and to provide the higher of the charge pump voltage and a rail voltage when the pass gate is in the second, high-impedance state, the pass gate being controlled using the low-voltage control circuit;
a first pick-high circuit configured to receive the rail voltage and the charge pump voltage, and to provide the higher of the charge pump voltage and the rail voltage as a pick-high voltage to the low-voltage control circuit; and
a second pick-high circuit configured to receive a source voltage and a first terminal voltage of the pass gate, and to provide the higher of the source voltage and the first terminal voltage as the rail voltage.

2. The system of claim 1, wherein:
the low-voltage control circuit is configured to receive a switch control signal, and
when the pass gate is in the first, low-impedance state, the switch control signal is configured to be the higher of the charge pump voltage and the rail voltage.

3. The system of claim 1, wherein:
the low-voltage control circuit includes first and second p-type semiconductor (PMOS) transistors, each including a source, a gate, and a drain,
the drain of the first PMOS transistor is configured to receive the rail voltage, and the drain of the second PMOS transistor is configured to receive the charge pump voltage.

4. The system of claim 1, wherein:
the low-voltage control circuit is configured to receive a switch control signal, to provide the charge pump voltage when the switch control signal is in a first state, and to provide the higher of the charge pump voltage and the rail voltage when the switch control signal is in a second state, and
the switch control signal in the first state is from the first pick-high circuit.

5. The system of claim 1, wherein:
the low-voltage control circuit is configured to receive a switch control signal, and
the pass gate is in the first, low-impedance state when the switch control signal is in the first state.

6. The system of claim 1, wherein:
the second pick-high circuit is configured to receive a source voltage and a first terminal voltage of the pass gate,
the first terminal voltage is the voltage at the first terminal of the pass gate, and
the charge pump voltage is based on the first terminal voltage.

7. The system of claim 6, wherein:
the second pick-high circuit is configured to receive the source voltage, the first terminal voltage of the pass gate, and a second terminal voltage of the pass gate,
the second terminal voltage is the voltage at the second terminal of the pass gate, and
the charge pump voltage is based on at least one of the first or second terminal voltages.

8. The system of claim 1, wherein the pick-high voltage from the first pick-high circuit is a first pick-high voltage, the second pick-high circuit provides a second pick-high voltage as the higher of the first terminal voltage, a second terminal voltage of the pass gate, and the source voltage, the system further comprising:
a translator circuit configured to receive the first pick-high voltage, the second pick-high voltage, and a control signal, the translator circuit configured to provide an output using the higher of the first and second pick-high voltages and the control signal,
wherein, when the pass gate is in the first, low-impedance state, a switch control signal includes the output of the translator circuit.

9. A low-voltage control apparatus, comprising:
a first pick-high circuit configured to receive a rail voltage and a charge pump voltage, and to provide the higher of the rail voltage and the charge pump voltage as a pick-high voltage;
a second pick-high circuit configured to receive a source voltage and a first terminal voltage of a pass gate, and to provide the higher of the source voltage and the first terminal voltage as the rail voltage; and
a low-voltage control circuit configured to receive the charge pump voltage, the rail voltage, and a switch control signal, the low-voltage control circuit configured to receive the pick-high voltage from the first pick-high circuit;
the low-voltage control circuit configured to provide the charge pump voltage when the switch control signal is in a first state, and to provide the higher of the charge pump voltage and the rail voltage when the switch control signal is in a second state,
the switch control signal in the first state including the pick-high voltage of the first pick-high circuit.

10. The apparatus of claim 9, wherein:
the pass gate is configured to pass a signal from the first terminal to a second terminal in a first, low-impedance state, and to isolate the first terminal from the second terminal in a second, high-impedance state,
the pass gate is controlled using the low-voltage control circuit.

11. The apparatus of claim 10, wherein, when the pass gate is in the first, low-impedance state, the switch control signal is configured to be the higher of the charge pump voltage and the rail voltage.

12. The apparatus of claim 9, wherein:
the low-voltage control circuit includes first and second p-type semiconductor (PMOS) transistors, each including a source, a gate, and a drain,
the drain of the first PMOS transistor is configured to receive the rail voltage, and the drain of the second PMOS transistor is configured to receive the charge pump voltage, and
the sources of the first and second PMOS transistors is configured to receive the pick-high voltage.

13. The apparatus of claim 9, wherein:
the first terminal voltage is the voltage at the first terminal of the pass gate, and
the charge pump voltage is based on the first terminal voltage.

14. The apparatus of claim 13, wherein:
the second pick-high circuit is configured to receive a second terminal voltage of the pass gate, and to provide the higher of the first terminal voltage, the second terminal voltage, and the source voltage as the rail voltage,
the second terminal voltage is the voltage at the second terminal of the pass gate, and
the charge pump voltage is based on at least one of the first or second terminal voltages.

15. The apparatus of claim 14, wherein the pick-high voltage from the first pick-high circuit is a first pick-high voltage, the second pick-high circuit provides a second pick-high voltage as the higher of the first terminal voltage, the second terminal voltage, and the source voltage,
the apparatus further comprising:
a translator circuit configured to receive the first pick-high voltage, the second pick-high voltage, and a control signal, the translator circuit configured to provide an output using the higher of the first and second pick-high voltages and the control signal,
the switch control signal includes the output of the translator circuit when the pass gate is in a first, low-impedance state.

16. A method comprising:
producing a pick-high voltage at a first pick-high circuit based on a rail voltage and a charge pump voltage;
producing a rail voltage at a second pick-high circuit based on a source voltage and a first terminal voltage of a pass gate;
receiving the charge pump voltage, the rail voltage, and a switch control signal at a low-voltage control circuit;
providing the higher of the charge pump voltage and the rail voltage as a pick-high voltage to the low-voltage control circuit; and
providing the charge pump voltage at an output of the low-voltage control circuit when the switch control signal is in a first state, and the higher of the charge pump voltage and the rail voltage when the switch control signal is in a second state.

17. The method of claim 16, further comprising:
passing a signal from a first terminal of a pass gate to a second terminal of the pass gate in a first, low-impedance state;
isolating the first terminal of the pass gate from the second terminal of the pass gate in a second, high-impedance state; and
controlling the pass gate using the output of the low-voltage control circuit.

18. The method of claim 16, wherein:
the low-voltage control circuit includes first and second p-type semiconductor (PMOS) transistors, each including a source, a gate, and a drain,
the drain of the first PMOS transistor is configured to receive the rail voltage, and the drain of the second PMOS transistor is configured to receive the charge pump voltage, and
the sources of the first and second PMOS transistors are configured to receive the pick-high voltage.

19. The method of claim 16,
wherein the switch control signal in the first state includes the pick-high voltage of the first pick-high circuit.

20. The method of claim 19,
wherein the charge pump voltage is based on the first terminal voltage.

21. The low-voltage control system of claim 1, further comprising:
a translator configured to receive the pick-high voltage and configured to provide a translated output to drive the low-voltage control circuit.

* * * * *